United States Patent

Sacchetti

[11] Patent Number: 6,015,249
[45] Date of Patent: Jan. 18, 2000

[54] DEVICE AND METHOD FOR CONTROLLING THE MACHINING DEPTH OF A MACHINE FOR MACHINING MULTILAYER PRINTED CIRCUIT BOARDS

[75] Inventor: Gentile Sacchetti, Lessolo, Italy

[73] Assignee: Pluritec Italia S.p.A., Via Torrione, Italy

[21] Appl. No.: 08/856,793

[22] Filed: May 15, 1997

[30] Foreign Application Priority Data

May 17, 1996 [IT] Italy .................................. TO96A0415

[51] Int. Cl.[7] .................................................. B23Q 15/00
[52] U.S. Cl. .............................. 409/186; 408/10; 408/13; 408/95; 364/474.02; 409/193; 409/218
[58] Field of Search .................. 408/3, 10, 13, 408/95; 409/80, 184, 186, 193, 218; 364/474.02

[56] References Cited

U.S. PATENT DOCUMENTS

| | | | |
|---|---|---|---|
| 3,527,138 | 9/1970 | Boltz | 408/13 |
| 4,203,691 | 5/1980 | Nishimura et al. | 408/13 |
| 4,451,892 | 5/1984 | McMurty | 408/13 |
| 4,657,451 | 4/1987 | Tanaka | 409/186 |
| 4,765,784 | 8/1988 | Karwan | 408/13 |
| 4,826,370 | 5/1989 | Conradsson | 409/218 |
| 5,123,789 | 6/1992 | Ohtani et al. | 408/1 R |
| 5,139,376 | 8/1992 | Pumphrey | 408/1 R |

FOREIGN PATENT DOCUMENTS 43 40 249 A1  6/1995  Germany .

52-13187  2/1977  Japan .................................. 409/186

OTHER PUBLICATIONS

"Capacitive Top Reference Detection for Blind Hole Drilling of PC Panels", IBM Technical Disclosure Bulletin, vol. 33, No. 3A, Aug. 1990, pp. 239–241.

"Drilling Holes of Accurate Depth", IBM Technical Disclosure Bulletin, vol. 35, No. 3, Aug. 1992, p. 367.

Database WPI, Week 9228, Derwent Publications Ltd., London, GB; AN 92–422419, XP–002071910 & SE 9 003 587 A (Schmitz), May 10, 1992.

Patent Abstracts of Japan, vol. 18, No. 390 (E–1582), Jul. 21, 1994 & JP 06 112659 A (Nippondenso Co), Apr. 22, 1994.

*Primary Examiner*—Daniel W. Howell
*Attorney, Agent, or Firm*—Sheridan Ross P.C.

[57] ABSTRACT

The device includes an operating head movable by a control unit with respect to a board for machining; the operating head includes a board holder device and an electric motor for a tool spindle; the rotor of the motor rotates with respect to the stator on air-cushion supports, and the stator slides axially on a further air-cushion support and is insulated with respect to the operating head; a signal generator senses the capacitance between the rotor and the stator, and generates an electric signal upon the tool on the spindle contacting the upper surface of the board; and the signal is used to define a reference dimension relative to the upper surface, and to so condition the control unit as to feed the tool to a predetermined depth as of the upper surface.

16 Claims, 6 Drawing Sheets

DEVICE AND METHOD FOR CONTROLLING THE MACHINING DEPTH OF A MACHINE FOR MACHINING MULTILAYER PRINTED CIRCUIT BOARDS

BACKGROUND OF THE INVENTION

The present invention relates to a device and method for controlling the machining depth of a machine for machining multilayer printed circuit boards.

In the fabrication of multilayer printed circuit boards, the board must be drilled and/or milled to a predetermined, precisely controlled depth, the purpose of the machining operation, in fact, normally being to reach a given conducting layer and no further. Owing to the uneven upper surface of the board, however, controlling the machining depth with reference to the machine itself, e.g. the worktable, would inevitably result in depth control errors.

In one known machine for drilling multilayer boards, machining depth is controlled according to the position of the tip of the tool on the spindle with respect to the board holder bush, which therefore acts as a feeler for the upper surface of the board, from which the machining depth is controlled. Such a machine, however, presents the drawback of the position of the tip of the tool with respect to the board holder bush varying as a result of both wear and the temperature of the spindle.

In another known drilling machine, the reference position of the tip of the tool is determined by bringing the spindle up to the steady-state temperature and probing with the tool a reference board fitted to the edge of the worktable. More specifically, the tool locates an air-cushion piston fitted to the reference board; and an electric reference signal is generated by a proximity sensor as the tool contacts the piston.

This device presents the drawback of involving a small amount of movement of the piston to generate the reference signal. Moreover, the assembly comprising the air-cushion piston and proximity sensor is fairly complicated and expensive to produce.

SUMMARY OF THE INVENTION

It is an object of the present invention to provide a highly straightforward, reliable device for controlling the machining depth of multilayer boards, designed to overcome the aforementioned drawbacks typically associated with known devices.

According to the present invention, there is provided a device for controlling machining depth, and comprising an operating head movable by an electronic control unit with respect to a board to be machined; said head comprising a board holder device, and an electric motor for a tool spindle; said electric motor comprising a rotor integral with said spindle, and a stator fitted to said head and movable axially towards said board; and air-cushion supporting means being provided between said rotor and said stator; characterized by comprising a generator for generating electric signals and for sensing contact of a tool on said spindle with a conducting layer of said board, to define a machining depth reference dimension; and enabling means for so conditioning said control unit as to feed said stator to a predetermined depth as of said reference dimension so defined.

BRIEF DESCRIPTION OF THE DRAWINGS

A preferred, non-limiting embodiment of the present invention will be described by way of example with reference to the accompanying drawings, in which.

DETAILED DESCRIPTION OF THE INVENTION

Figure 1:
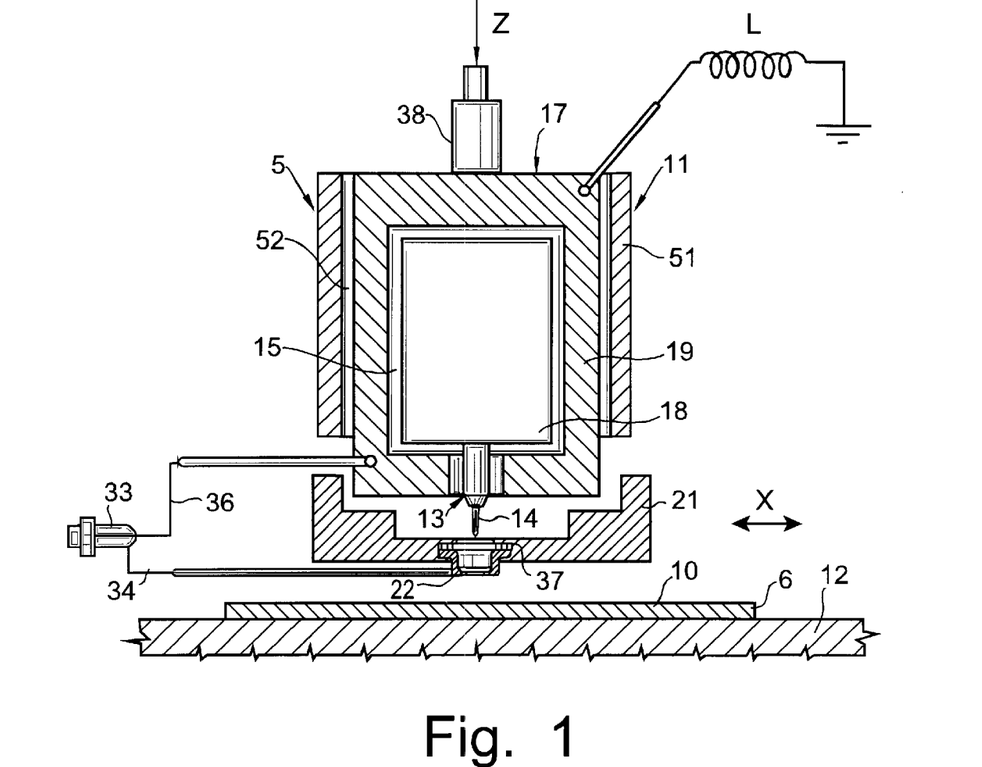
FIG. 1 shows a machine for machining printed circuit boards and featuring a machining depth control device in accordance with the present invention.

Number 5 in FIG. 1 indicates a machine for mechanically machining multilayer printed circuit boards 6, which, as is known, are normally four-sided, preferably rectangular, and may comprise two or more rigid layers 7 (FIG. 2) made, for example, of fiberglass-reinforced plastic, and a flexible layer 8 made, for example, of Mylar (registered trademark) and located between the two rigid layers 7.

Layers 7, 8 are deposited separately, on one or both faces, with an electrically conducting layer 9 of metal material to form the respective conducting tracks and pads; layers 7, 8 are bonded to one another; the edges of board 6 are trimmed; and board 6 is then mechanically machined, e.g. drilled and/or milled, to a strictly predetermined depth K from the upper surface 10 of board 6 to a particular conducting layer 9.

Figure 3:
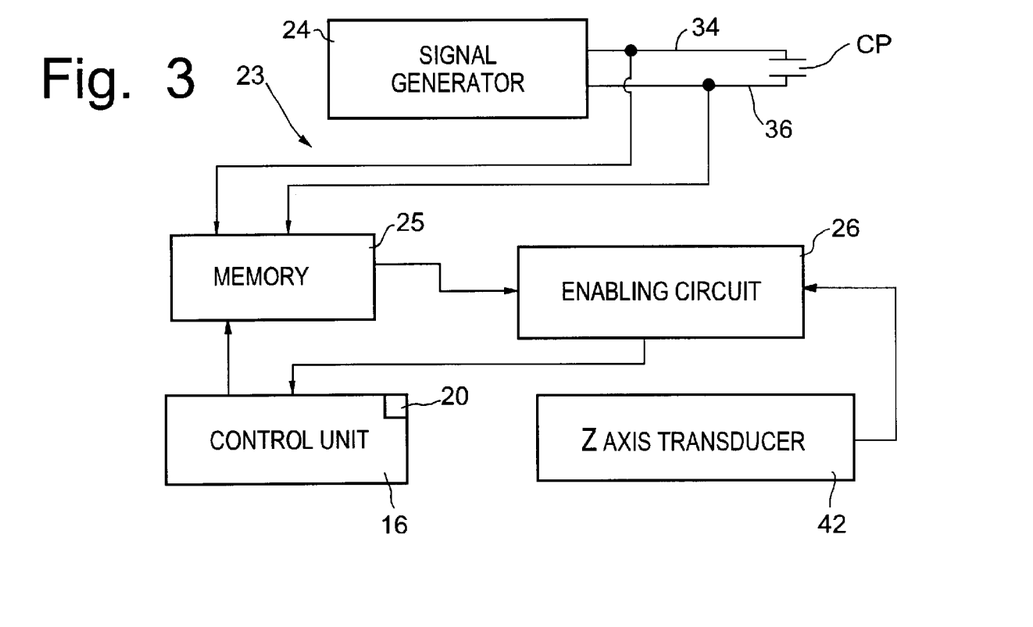
FIG. 3 shows a block diagram of the machine control unit and the device control circuit.

Machine 5, e.g. a drilling machine, comprises at least one operating head 11 (FIG. 1) movable with respect to a worktable 12 along two coordinate horizontal axes X and Y (only the X axis shown in FIG. 1). Head 11 comprises a spindle 13 supporting a drilling tool 14, and which is movable in known manner along a vertical axis Z to effect the forward travel of tool 14. All the movements along the X, Y and Z axes are controlled by an electronic numeric-control feedback unit indicated as a whole by 16 (FIG. 3).

Spindle 13 (FIG. 1) is rotated by an asynchronous a.c. electric motor indicated as a whole by 17, and which is integrated with spindle 13 to form an electric spindle 13, 17. More specifically, motor 17 comprises a rotor 18 integral with spindle 13 and rotating inside a stator 19 fitted to head 11.

Stator 19 is moved along the Z axis together with rotor 18, which rotates on a series of air-cushion supports defining a gap 15, as described in detail later on. As rotor 18 and spindle 13 rotate, therefore, any mechanical contact between rotor 18 and stator 19 is excluded, and rotor 18 is electrically insulated with respect to stator 19.

Operating head 11 also comprises a board holder device 21, which, when activated, engages the upper surface 10 of board 6 by means of a board holder bush 22 to press board 6 on to worktable 12 before the board is engaged by tool 14. As is known, for safety reasons, both head 11 and worktable 12 must be electrically grounded.

Drilling machine 5 is equipped with a machining depth control device indicated as a whole by 23 (FIG. 3) and controlled by control unit 16. For which purpose, unit 16 is so programmed as to enable device 23 to control drilling depth K (FIG. 2), and comprises hardware or software registers 20 for storing various depth K values.

According to the present invention, device 23 comprises a generator 24 for generating an electric signal in response to tool 14 contacting surface 10 of a metal layer 9; a memory 25 for storing the signal so generated; and enabling means in turn comprising a circuit 26 enabled by memory 25 and for so conditioning unit 16 as to control drilling depth according to a memorized K value.

More specifically, generator 24 (FIG. 4) comprises a known low-pass, wide-band, so-called pi filter 27 substantially comprising an inductor L1 located in series between two capacitors C1 and C2; filter 27 is supplied by a high-frequency oscillator 29 via an output power amplifier 31; and a regulated, so-called switching, power supply 28 supplies oscillator 29 and the other electronic components of device 23.

Figure 4:
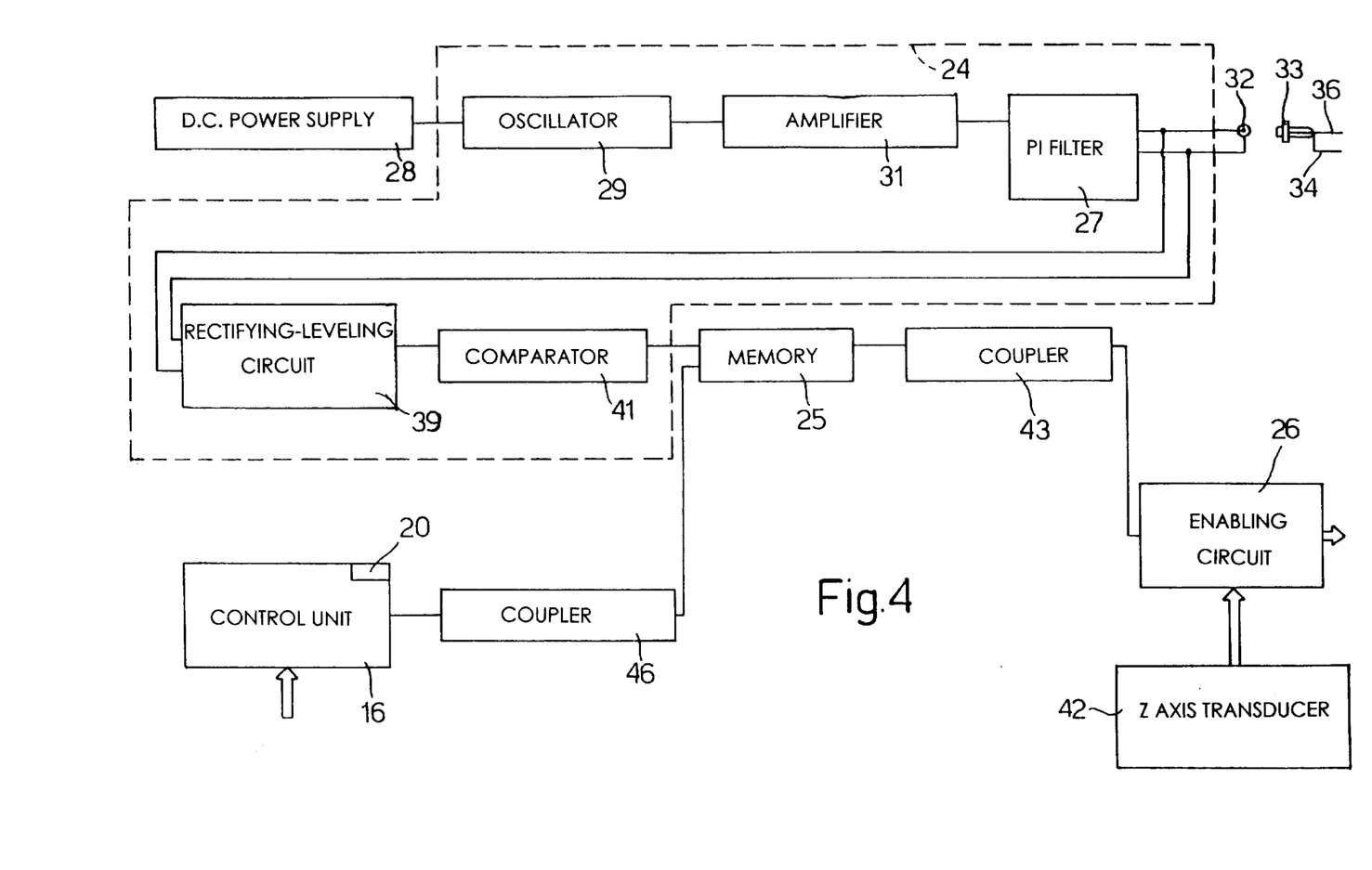
FIG. 4 shows a detailed diagram of the logic blocks of the device control circuit.

Oscillator 29 is frequency adjustable within certain limits, and may be selected to generate a sinusoidal signal of 400 to 1200 kHz frequency. Amplifier 31 is a so-called class A type, provides for linear amplification of the amplitude of the sinusoidal signal, and may advantageously be selected to supply a peak-to-peak signal amplitude of 15 to 20 volts, and preferably of about 18 volts.

More specifically, the frequency generated by oscillator 29 must be selected as a function of the physical characteristics of electric spindle 13, 17, i.e. as a function of the in-service parasitic capacitance CP (FIGS. 1 and 3) between stator 19 and rotor 18, due to the gap 15 defined by the air-cushion supports. As capacitance CP normally ranges beteen 10 and 12 picofarads, oscillator 29 (FIG. 4) may advantageously be selected to generate a signal of about 1000 kHz frequency.

Filter 27 must be so selected as to be tuned to the output frequency of oscillator 29, and is therefore referred to hereinafter as the tuned filter. Filter 27 therefore transmits the selected output frequency at maximum energy, attenuates or suppresses the other frequencies, in particular the harmonics of the selected frequency, and may advantageously be tuned to a frequency range differing by plus or minus 50 kHz from the selected frequency.

The output of tuned filter 27 comprises two wires connected to a connector 32, to which may be connected a complementary connector 33 connected to a further two wires 34 and 36. Wire 34 is connected electrically to bush 22 (FIG. 1), which is normally made of conducting material and fitted removably to device 21. According to the invention, bush 22 is insulated with respect to device 21, e.g. by means of a ring 37 of insulating material, or device 21 may be made entirely of insulating material, e.g. ceramic.

Wire 36, on the other hand, is connected electrically to stator 19, which in turn is connected to head 11 by a joint 38 insulated electrically from head 11, as described later on. For safety reasons, however, stator 19 is grounded by an inductor L, e.g. of about 500 microhenries, which insulates the stator at the operating frequency, but acts as a resistor at mains frequency.

The capacitance at the output of tuned filter 27 (FIG. 4) therefore normally assumes a first low value when tool 14 is detached from surface 10 of board 6, so that the peak-to-peak amplitude A of the output signal of filter 27 (FIG. 5) is about 18 volts. Conversely, when the tip of tool 14 contacts surface 10 of metal layer 9 of board 6, the parasitic capacitance CP between stator 19 and rotor 18 is inserted parallel with capacitance C2 of tuned filter 27. Since capacitance CP is much higher than that in the absence of contact by tool 14, the reactance of filter 27 is reduced, and the peak-to-peak amplitude a of the output signal falls to about 2 volts, well below the above mentioned amplitude A.

Figure 5:
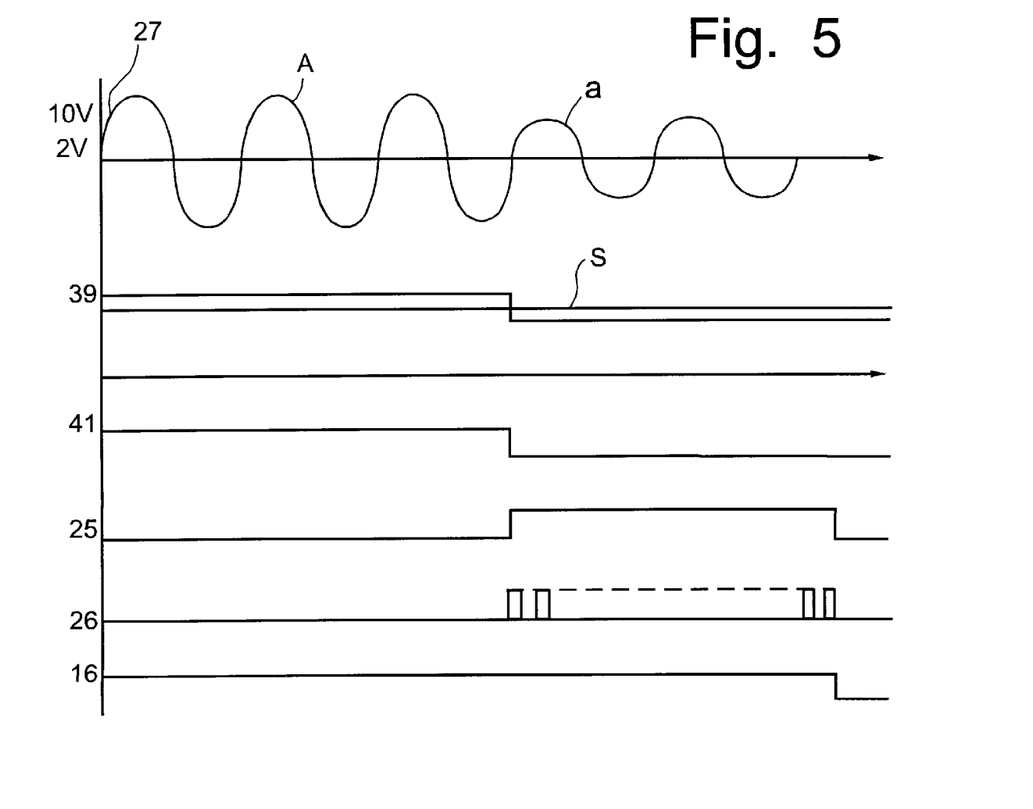
FIG. 5 shows a graph of the electric signals generated by the blocks in FIG. 4.

Generator 24 (FIG. 4) also comprises a circuit 39 for rectifying and leveling the incoming signal, and which substantially comprises a diode and a capacitor, and generates a rectified, substantially leveled output signal (see also FIG. 5, in which the signals are indicated on the left by the reference numbers of the respective circuits). The output signal of circuit 39 is supplied to a comparator 41 for comparison with a threshold signal S.

Threshold S must be so selected as to permit comparator 41 to pass from a high signal when tool 14 is detached from surface 10, to a low signal when tool 14 contacts surface 10. The low signal is stored in memory 25, which substantially comprises a flip-flop set to memorize only the first contact of tool 14 with surface 10, so that, until it is reset, any bounce or subsequent contact has no effect on the state of the flip-flop.

Enabling circuit 26 normally blocks the digital signals received from a normal Z axis position transducer 42; and, when set, memory 25 conditions circuit 26 to supply the digital signals to unit 16 to feedback control the travel of electric spindle 13, 17. A second photocoupler 46 is located between control unit 16 and memory 25; and, at the end of each drilling cycle, unit 16 supplies an end-of-cycle signal to reset memory 25.

Control device 23 operates as follows.

Once board 6 (FIG. 1) is fixed to worktable 12, unit 16 moves head 11 with respect to worktable 12 along the X and Y axes to position tool 14 vertically over the point to be drilled; unit 16 lowers device 21 so that bush 22 (FIG. 2) presses on surface 10 of board 6; and oscillator 29 (FIG. 4) causes amplifier 31 to generate a train of sinusoidal waves (FIG. 5) of the selected frequency and amplitude, and which are filtered by tuned filter 27. Since the tip of tool 14 is detached from board 6, the output wave of filter 27 has the highest amplitude A.

At this point, unit 16 lowers electric spindle 13, 17 until the tip of tool 14 contacts upper surface 10 of conducting layer 9 of board 6. Since, at this point in time, tuned filter 27 is connected to capacitance C between stator 19 and rotor 18, circuit 41 generates a trailing edge of the respective output signal to set flip-flop 25. Via photocoupler 43, flip-flop 25 conditions circuit 26 to supply the digital signals from transducer 42 to unit 16, which, by feedback control, lowers electric spindle 13, 17 by the number of elementary steps corresponding to the depth K memorized in register 20, arrests the travel of electric spindle 13, 17, and emits an end-of-cycle signal to reset flip-flop 25 via photocoupler 46.

Figure 6:
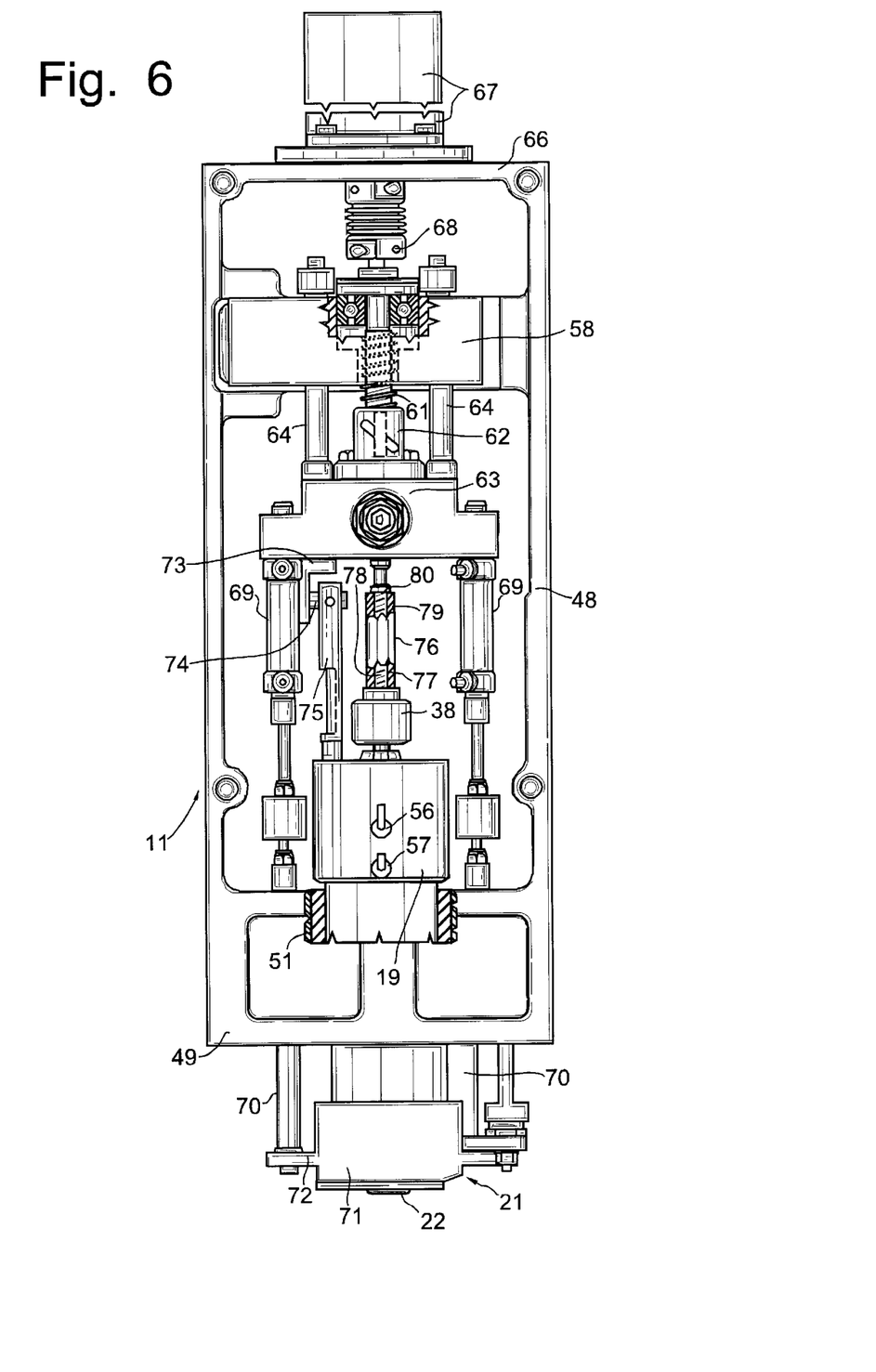
FIG. 6 shows a partially sectioned front view of an operating head fitted with the control device.
Figure 7:
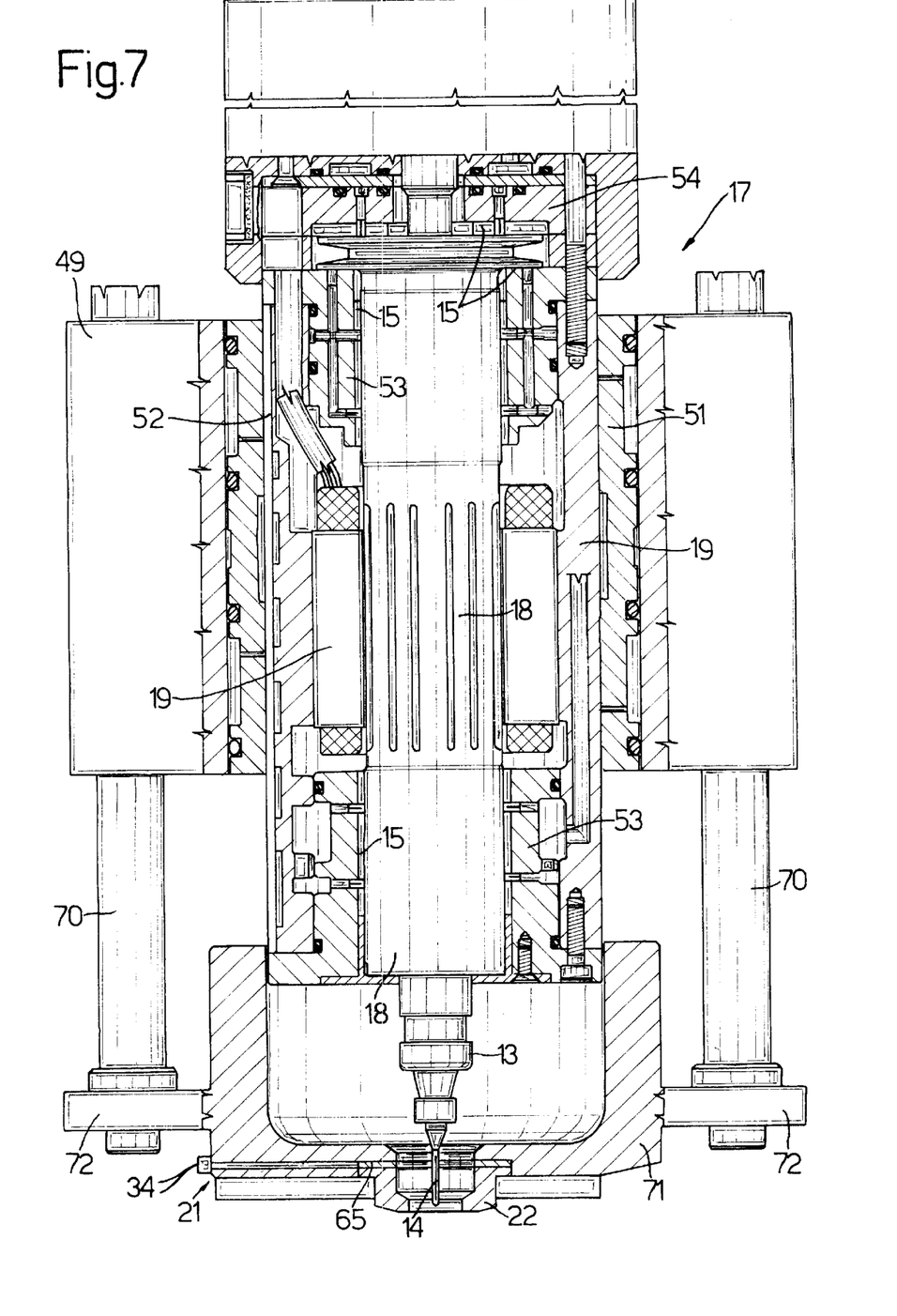
FIG. 7 shows a partial section of the FIG. 6 head.

With reference to FIG. 6, operating head 11 comprises an aluminium alloy body 48 with a bottom crosspiece 49 comprising a seat in which is fitted an air-cushion bush 51 for creating, in use, a further air-cushion gap 52 (FIG. 7). Stator 19 is fitted in axially-sliding manner inside bush 51 (FIG. 6) as described in Italian Patent Application TO93A 000831 filed on Nov. 5, 1993, by the present Applicant.

Stator 19 comprises two air-cushion supports 53 for supporting rotor 18 by means of radial air cushions; an air-cushion support 54 for supporting rotor 18 by means of an axial air cushion, supports 53 and 54 creating, in use, gap 15 (FIG. 1); a fitting 56 (FIG. 6) for insertion of the electric supply wires and inductor L; and a fitting 57 for connecting wire 36.

Head 11 also comprises a fixed top crosspiece 58 in turn comprising a central opening 59 housing for rotation the top end of a screw 61. Screw 61 engages a nut screw 62 fitted to a movable crosspiece 63 also fitted with two columns 64 sliding inside two bushes on fixed crosspiece 58. Head 11 also comprises a top wall 66 fitted with a d.c. electric motor 67 for controlling the travel of electric spindle 13, 17, for which purpose, the shaft of motor 67 is connected to the top end of screw 61 by a further joint 68.

Movable crosspiece 63 is connected by two pneumatic actuators 69 to two columns 70 fitted with board holder device 21, which substantially comprises a ring 71 fitted removably with bush 22 by means of an electrically conducting washer 65 to which wire 34 is connected. Ring 71 comprises two integral arms 72 fitted to the bottom ends of columns 70; and ring 71 and arms 72 may advantageously be made of known 35-70 anodized anticorodal aluminium, which is sufficiently insulating electrically.

Crosspiece 63 is fitted at the bottom with a bracket 73 engaged by a pin 74 for preventing stator 19 from rotating inside bush 51, and which is fitted to a rod 75 integral with stator 19. Joint 38 is connected to crosspiece 63 by a column 76 comprising a bottom threaded seat 77 which is screwed on to a screw 78 of joint 38, and a top threaded seat 79 which is screwed on to a further threaded pin 80 fitted to crosspiece 63. To insulate stator 19 electrically with respect to head 11, both pin 74 and column 76 are made of insulating material, e.g. Delrin (registered trademark).

Figure 8:
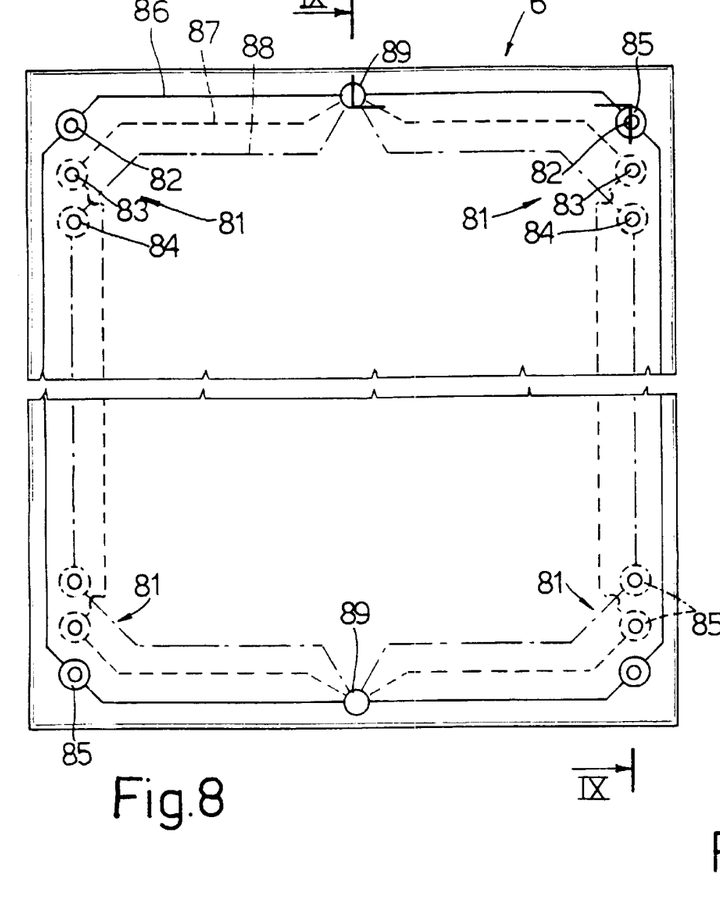
FIG. 8 shows a printed circuit board ready for machining.
Figure 9:
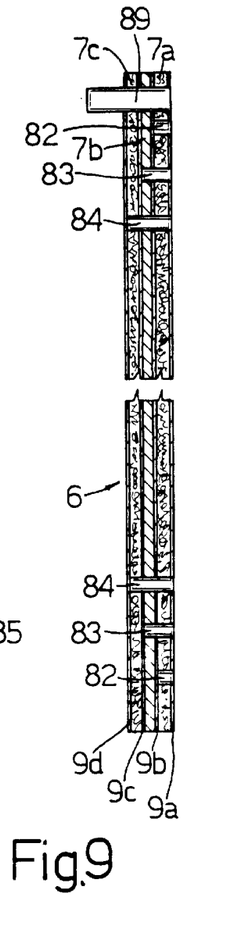
FIG. 9 shows a section along line IX—IX in FIG. 8.

According to a further characteristic of the invention, for more accurately controlling machining depth K, board 6 (FIGS. 8 and 9) may be provided with at least two series 81 of holes, in which each hole extends up to a respective conducting layer 9. In FIG. 9, board 6 comprises four conducting layers 9a, 9b, 9c, 9d alternating with three fiberglass-reinforced plastic layers 7a, 7b, 7c; and each series 81 of holes comprises a hole 82 through layers 9a, 7a up to layer 9b, a hole 83 through the same layers as hole 82 and through layers 9b, 7b up to layer 9c, and a hole 84 through the same layers as hole 83 and through layers 9c, 7c up to layer 9d.

Figure 2:
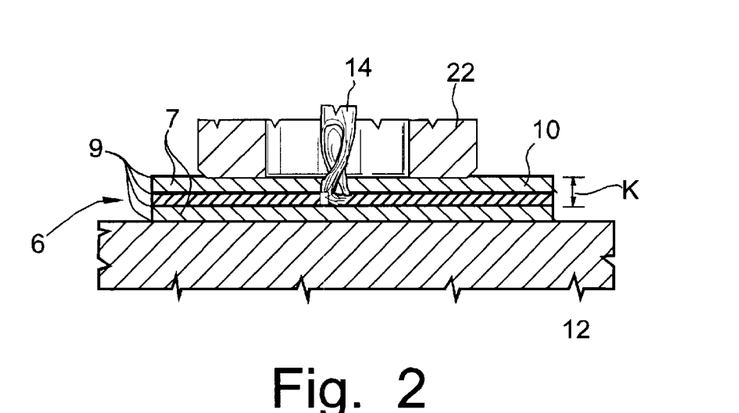
FIG. 2 shows a schematic, larger-scale section of a detail of the FIG. 1 machine.

At each hole 82–84, the respective conducting layer 9b, 9c, 9d comprises a pad 85 connected by a respective conducting track 86, 87, 88 to the two metal pins 89 normally provided on board 6 for positioning it with respect to worktable 12, and which, in use, provide for electrically connecting pads 85 to bush 22 (FIG. 2). As board 6 is normally four-sided, provision may advantageously be made for four series 81 of holes 82–84, each located adjacent to a respective corner of board 6.

Prior to the actual drilling cycle, control unit 16 (FIG. 4) is programmed to perform a self-teaching cycle to determine the actual distances between layers 9b–9d and surface 10 of board 6. That is, unit 16 first inserts tool 14 through holes 82–84 to locate and acquire the depth of layers 9b–9d in the four series 81 of holes 82–84; determines the mean thickness of pairs of layers 9a-7a, 9b-7b, 9c-7c and the mean depth of the four corresponding holes 82–84; and memorizes the various mean values in respective registers 20, for use as the depth value K by which to drill the specific board 6.

Figure 10:
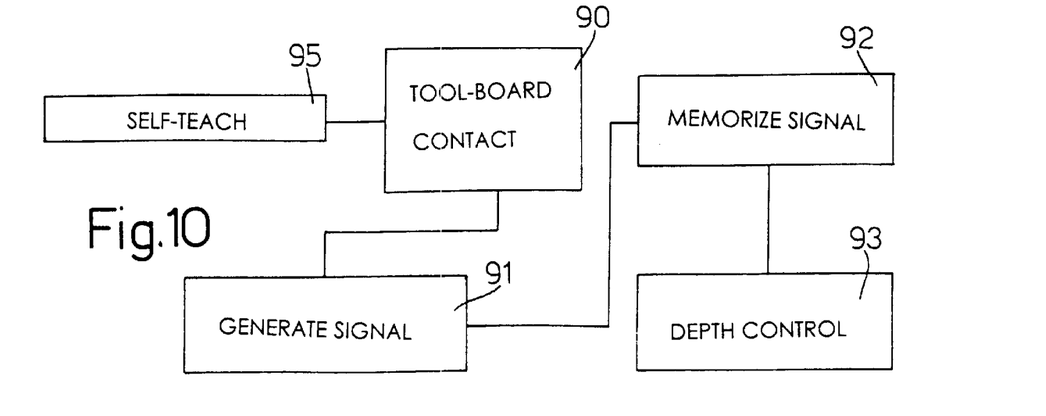
FIG. 10 shows a block diagram of the steps in the machining depth control method.

Device 23 therefore provides for a machining depth control method comprising a step 90 (FIG. 10) for determining electrical contact between tool 14 and board 6; a step 91 for generating a signal indicating a predetermined capacitance between stator 19 and rotor 18 following contact; a step 92 for memorizing said signal; and a step 93 for controlling the machining depth K at which said signal was generated. If the board comprises at least one series 81 of holes 82–84, the method also comprises a self-teaching step 95 to determine depth K by probing holes 82–84.

As compared with known devices, the advantages of machining depth control device 23 according to the invention will be clear from the foregoing description. In particular, it provides for eliminating errors due to determining the position of the tool with respect to the board holder; for eliminating the complications involved in the manufacture of the proximity sensor and air-cushion piston of known devices; and, finally, by automatically determining the thickness of layers 7, 9 in holes 82–84, for eliminating errors due to varying thicknesses of boards 6, even in the same production lot.

Clearly, changes may be made to the device as described and illustrated herein without, however, departing from the scope of the present invention. For example, changes may be made to logic control circuits 24 and/or to the structure of electric spindle 13, 17; to the insulation of stator 19 with respect to head 11; and, finally, to the number and location of series 81 of holes 82–84 for the self-teaching step. If necessary, even only one series 81 of holes 82–84 may be provided.

I claim:

1. A device for controlling the machining depth of a machine for machining multilayer printed circuit boards, comprising an operating head (11) movable by an electronic unit (16) with respect to a board (6) to be machined; said head (11) comprising a board holder device (21), and an electric motor (17) for a tool spindle (13); said electric motor (17) comprising a rotor (18) integrated with said spindle (13), and a stator (19) fitted to said head (11) and movable axially towards said board (6); air-cushion supporting means (53, 54) being provided between said rotor (18) and said stator (19); and further comprising a generator (24) for generating electric signals at a predetermined operating frequency and for sensing contact of a tool (14) on said spindle (13) with a conducting layer (9) of said board (6) to define a machining depth reference dimension, said stator (19) being connected electrically to said head (11) by an inductor (L) for insulating the stator (19) from said head (11) at least at said operating frequency; and enabling means (26) for so conditioning said control unit (16) as to feed said stator (19) to a predetermined depth (K) departing from said reference dimension so defined.

2. A device for controlling the machining depth of a machine for machining multilayer printed circuit boards, comprising an operating head (11) movable by an electronic unit (16) with respect to a board (6) to be machined; said head (11) comprising a board holder device (21), and an electric motor (17) for a tool spindle (13); said electric motor (17) comprising a rotor (18) integral with said spindle (13), and a stator (19) fitted to said head (11) and movable axially towards said board (6); air-cushion supporting means (53, 54) being provided between said rotor (18) and said stator (19); and further comprising a signal generator (24) sensitive to the capacitance between said stator (19) and said board (6) and between said stator (19) and said rotor (18), said generator (24) sensing contact of a tool (14) on said spindle (13) with a conducting layer (9) of said board (6) for generating electric signals to define a machining depth reference dimension; and enabling means (26) for so conditioning said control unit (16) as to feed said stator (19) to a predetermined depth (K) departing from said reference dimension so defined, said device able to control the machining depth of the multi-layer printed circuit boards.

3. A device as claimed in claim 1, characterized in that said generator (24) is sensitive to the capacitance between said stator (19) and said board (6) and between said stator (19) and said rotor (18).

4. A device as claimed in claim 2, characterized in that said generator (24) is connected electrically on one said to said stator (19) and on the other side to said board holder device (21); said generator (24) sensing the variation between said capacitance in the absence of contact between said tool (14) and said board (6), and the residual capacitance between said stator (19) and said rotor (18) in the presence of said contact.

5. A device as claimed in claim 2, characterized in that said generator (24) generates said signals at a predetermined operating frequency and comprises a filter (27) tuned at the output to said frequency; said filter (27) being supplied by an oscillator (29) for generating said frequency.

6. A device as claimed in claim 5, characterized in that said oscillator (29) generates said frequency with a predetermined amplitude; an amplitude amplifier (31) being provided between said oscillator (29) and said filter (27).

7. A device as claimed in claim 6, characterized in that said oscillator (29) generates a sinusoidal signal of a frequency of 400 to 1200 kHz; said amplifier (31) generating an output signal with a peak-to-peak amplitude of 8 to 15 volts.

8. A device for controlling the machining depth of a machine for machining multilayer printed circuit boards, comprising an operating head (11) movable by an electronic unit (16) with respect to a board (6) to be machined; said head (11) comprising a board holder device (21), and an electric motor (17) for a tool spindle (13); said electric motor (17) comprising a rotor (18) integral with said spindle (13), and a stator (19) fitted to said head (11) and movable axially towards said board (6); air-cushion supporting means (53, 54) being provided between said rotor (18) and said stator (19); and further comprising a signal generator (24) sensitive to the capacitance between said stator (19) and said board (6) and between said stator (19) and said rotor (18), said generator (24) sensing contact of a tool (14) on said spindle (13) with a conducting layer (9) of said board (6) for generating electric signals to define a machining depth reference dimension; and enabling means (26) for so conditioning said control unit (16) as to feed said stator (19) to a predetermined depth (K) departing from said reference dimension so defined, wherein said generator (24) is connected electrically on one said to said stator (19) and on the other side to said board holder device (21); said generator (24) sensing the variation between said capacitance in the absence of contact between said tool (14) and said board (6), and the residual capacitance between said stator (19) and said rotor (18) in the presence of said contact, characterized in that a memory element (25) memorizes a signal generated in response to said variation in capacitance; said memory element (25) conditioning said enabling means (26) for controlling machining according to said predetermined depth (K).

9. A device as claimed in claim 8, characterized in that said memory element substantially comprises a flip-flop (25) which is reset by said control unit (16) at the end of each machining cycle.

10. A device as claimed in claim 8, further comprising a circuit (39) for rectifying and leveling the signals emitted by said filter (27); and a comparator (41) for comparing said rectified and leveled signals with a reference signal (S) to generate said signal for said memory element (25).

11. A device as claimed in claim 10, characterized in that said enabling means comprise a circuit (26) which is enabled by said memory element (25) to supply said control unit (16) with position signals emitted by a position transducer (42), to feedback control the travel of said spindle (13).

12. A device for controlling the machining depth of a machine for machining multilayer printed circuit boards, comprising an operating head (11) movable by an electronic unit (16) with respect to a board (6) to be machined; said head (11) comprising a board holder device (21), and an electric motor (17) for a tool spindle (13); said electric motor (17) comprising a rotor (18) integral with said spindle (13), and a stator (19) fitted to said head (11) and movable axially towards said board (6); air-cushion supporting means (53, 54) being provided between said rotor (18) and said stator (19); and further comprising a generator (24) for generating electric signals and for sensing contact of a tool (14) on said spindle (13) with a conducting layer (9) of said board (6) to define a machining depth reference dimension; and enabling means (26) for so conditioning said control unit (16) as to feed said stator (19) to a predetermined depth (K) departing from said reference dimension so defined; said predetermined depth (K) being determined by said control unit (16) in a self-teaching cycle by probing at least one hole (82–84) formed on said board (6) and extending up to a respective conducting layer (9b–9d) of said board (6).

13. A device as claimed in claim 12, characterized in that said board (6) is provided with at least two series (81) of holes (82–84); each hole (82–84) in each said series (81) extending up to a respective conducting layer (9b–9d) of said board (6); said conducting layers (9b–9d) being connected electrically to at least one pin (89); and said control unit (16) being programmed to probe, with said tool (14), the corresponding holes (82–84) in said series (81) and to determine a mean probing dimension.

14. A device as claimed in claim 13, characterized in that said board (6) is substantially quadrangular and comprises four series (81) of said holes (82–84); each series (81) being adjacent to each of the four corners of said board (6); said conducting layers (9b–9d) comprising pads (85) at the respective holes (82–84) in each series (81); and said pads (85) being connected electrically to said pin (89) by respective tracks (86–88).

15. A device for controlling the machining depth of a machine for machining multilayer printed circuit boards, comprising an operating head (11) movable by an electronic unit (16) with respect to a board (6) to be machined; said head (11)comprising a board holder device (21), and an electric motor (17) for a tool spindle (13); said electric motor (17) comprising a rotor (18) integral with said spindle (13), and a stator (19) connected to said head (11) by a column (76) for being axially moved towards said board (6), said stator (19) being also connected to an element (74) for preventing rotation of said stator (19); said column (76) and said element (74) being made of insulating material; air-cushion supporting means (53, 54) being provided between said rotor (18) and said stator (19); and further comprising a generator (24) for generating electric signals and for sensing contact of a tool (14) on said spindle (13) with a conducting layer (9) of said board (6) to define a machining depth reference dimension; and enabling means (26) for so conditioning said control unit (16) as to feed said stator (19) to a predetermined depth (K) departing from said reference dimension so defined.

16. A device for controlling the machining depth of a machine for machining multilayer printed circuit boards, comprising an operating head (11) movable by an electronic unit (16) with respect to a board (6) to be machined; said head (11) comprising a board holder device (21) including a ring (71) fitted removably with a bush (22) for engaging said board (6); and an electric motor (17) for a tool spindle (13); said electric motor (17) comprising a rotor (18) integral with said spindle (13), and a stator (19) fitted to said head (11) and movable axially towards said board (6); air-cushion supporting means (53, 54) being provided between said rotor (18) and said stator (19); and further comprising a generator (24) for generating electric signals and for sensing contact of a tool (14) on said spindle (13) with a conducting layer (9) of said board (6) to define a machining depth reference dimension; said bush (22) being electrically connected to said generator (24), said ring (71) being made of anticorodal metal which is insulating with respect to said bush (22); and enabling means (26) for so conditioning said control unit (16) as to feed said stator (19) to a predetermined depth (K) departing from said reference dimension so defined.

\* \* \* \* \*